United States Patent
Stenzel et al.

[11] Patent Number: 5,908,604
[45] Date of Patent: Jun. 1, 1999

[54] APPARATUS FOR GROWING ZEOLITE CRYSTALS FROM AN AQUEOUS SOLUTION

[75] Inventors: Christian Stenzel, Friedrichshafen; Harald Lenski, Überlingen; Werner Wiesbeck, Keltern--Ellmendingen; Frank Demmerle, Karlsruhe, all of Germany

[73] Assignee: Dornier GmbH, Germany

[21] Appl. No.: 08/773,499

[22] Filed: Dec. 23, 1996

[30] Foreign Application Priority Data

Dec. 23, 1995 [DE] Germany ............ 195 48 742

[51] Int. Cl.$^6$ .................................. B01D 21/00
[52] U.S. Cl. .................. 422/245.1; 117/206; 117/900
[58] Field of Search .............. 117/2, 3, 4, 206, 117/900; 422/90, 98, 245.1

[56] References Cited

U.S. PATENT DOCUMENTS

| | | | |
|---|---|---|---|
| 3,812,315 | 5/1974 | Martin | 219/688 |
| 4,368,174 | 1/1983 | Valyocsik | 422/208 |
| 4,374,093 | 2/1983 | Rollmann et al. | 422/202 |
| 4,778,666 | 10/1988 | Chu et al. | 423/700 |

FOREIGN PATENT DOCUMENTS 41 02 233  7/1992  Germany .
41 13 042  10/1992  Germany .

OTHER PUBLICATIONS

"Growth of Zeolite Crystallites and Coatings on Metal Surfaces", Shawn Davis, Eric Borgstedt and Steven Suib, Chem. Mater., vol. 2, No. 6, 1990, pp. 712–719.

Advanced Materials mag. article, "Communications", Jul., 1995, pp. 711–714.

Zeolites mag. article, "Microwave Preparation of Zeolite Y and ZSM–5", Mar. 1993, pp. 162–165.

Elektrowärme International mag. article, Aug. 1968, pp. 284–291.

Primary Examiner—Felisa Hiteshew
Attorney, Agent, or Firm—Evenson, McKeown, Edwards & Lenahan, P.L.L.C.

[57] ABSTRACT

The invention provides an apparatus for growing zeolite crystals from an aqueous solution in a metallic pressure tank for admitting pressure to the aqueous solution. Devices for feeding microwave energy into the aqueous solution comprise a capacitor between whose plates the aqueous solution is situated, one of the capacitor plates being formed by a wall of the pressure tank and the other capacitor plate being arranged in the interior of the pressure tank.

12 Claims, 3 Drawing Sheets

APPARATUS FOR GROWING ZEOLITE CRYSTALS FROM AN AQUEOUS SOLUTION

BACKGROUND AND SUMMARY OF THE INVENTION

This invention relates to an apparatus for growing zeolite crystals from an aqueous solution, by coupling microwave energy into the solution under pressure.

Zeolites are inorganic crystals with a pore or duct structure which is open toward the outside, and which permits versatile industrial applications. Zeolites are used, for example, as catalysts in the petrochemical industry, as additions to detergents, and as molecular sieves. Also, high-power sensors and microfilters are produced from zeolite crystals, and they are used as ion exchangers in applications for a more efficient purification of water and for the disposal of radioactive waste.

The conventional method for the production of zeolites in the lab is crystallization from an aqueous solution. For the optimal formation of zeolite crystals in this manner, it is necessary to heat the volume of the solution rapidly (within seconds) and locally in a uniform manner. The solution is held for up to 30 seconds at a temperature of 180° C. and is then cooled again to the ambient temperature. In order to avoid boiling of the solution at 180° C., a pressure of approximately 15 bar is required in the cell.

The requirement for a rapid and uniform heating of the aqueous zeolite solution can be implemented only by the use of microwaves. Conventionally heated resistance furnaces, for example, require hours for the heating. Furthermore, only the exterior edge of the specimen is heated directly; heat transport into the interior takes place with a certain time delay by way of thermal convection and heat conduction.

Crystallization by means of microwave heating was developed and tested only a few months ago. First promising results are available. (I. Girnus, et al., *Adv.Mater.* 1995, 7, No. 8, p. 711; A. Arafat, et al., *ZEOLITES*, 1993, Vol. 13, p. 162 ). In both cases, a pulsed MW system with mode mixing was used; nothing was reported concerning the homogeneity of the temperature distribution. In the case of Girnus, et al., the crystallization takes place without the admission of pressure. In the case of Arafat, et al., a container which is provided with a pressure piston and in which the zeolite solution was situated was arranged in a conventional microwave oven.

A first measurement of the dielectric constant $\epsilon'$ and $\epsilon''$ of a zeolite A-solution at room temperature, for a frequency of 2.45 GHz, resulted in the following values:

$$\epsilon' = \epsilon_0(\epsilon' - i\epsilon'')$$

$$\tan \delta = \epsilon''/\epsilon'$$

Zeolite A: $\tan \delta = 2.36$ (Water : $\tan \delta = 0.16$)

(Teflon : $\tan \delta = 0.002$)

In comparison to pure water, a loss factor is therefore obtained which is higher by a factor of 15; that is, the zeolite solution acts like an electrically poorly conducting material. The direct beaming-in of microwaves therefore causes only a heating of the exterior edge and no volumetric heating of the solution. The requirement of a uniform heating can therefore not be met by means of this process.

In the field of the heating of fluids, it is known (German Patent Document DE 41 02 233 A1; U.S. Pat. Document U.S. 38 12 315 ; Stuwe: "Conventional and Dielectric Heating of Honey", in *Elektrowärme International, No. 8*, 1968, P. 284 to 291) that uniform heating can be achieved if the fluid is subjected to a high-frequency electric field, or an electric field situated in the microwave range which exists between two capacitor plates. In this case, the heating takes place by the action of pressure on the fluid.

It is an object of the present invention to provide an apparatus for growing zeolite crystals from an aqueous solution under an increased pressure and a raised temperature, which permits uniform heating of the whole volume of the solution to be heated, and which requires minimal space.

This object is achieved by the apparatus according to the invention, which comprises a metallic pressure tank for admitting pressure to the aqueous solution, and devices for feeding microwave energy (for example, 2.45 GHz) into the aqueous solution by means of a capacitor between whose plates the aqueous solution to be heated is situated. One of the capacitor plates is formed by a wall of the pressure tank, while the other is arranged in its interior. The electric field distribution in a capacitor is homogeneous with the exception of edge effects, and while the entry of the zeolite solution causes a change of the capacity, it does not introduce field distortion.

By integration of the capacitor and the pressure tank according to the invention, an extremely compact and easily operable apparatus is obtained.

The apparatus according to the invention is suitable for growing zeolite crystals on board a spacecraft or on earth.

Other objects, advantages and novel features of the present invention will become apparent from the following detailed description of the invention when considered in conjunction with the accompanying drawings.

DETAILED DESCRIPTION OF THE DRAWINGS

Figure 1:
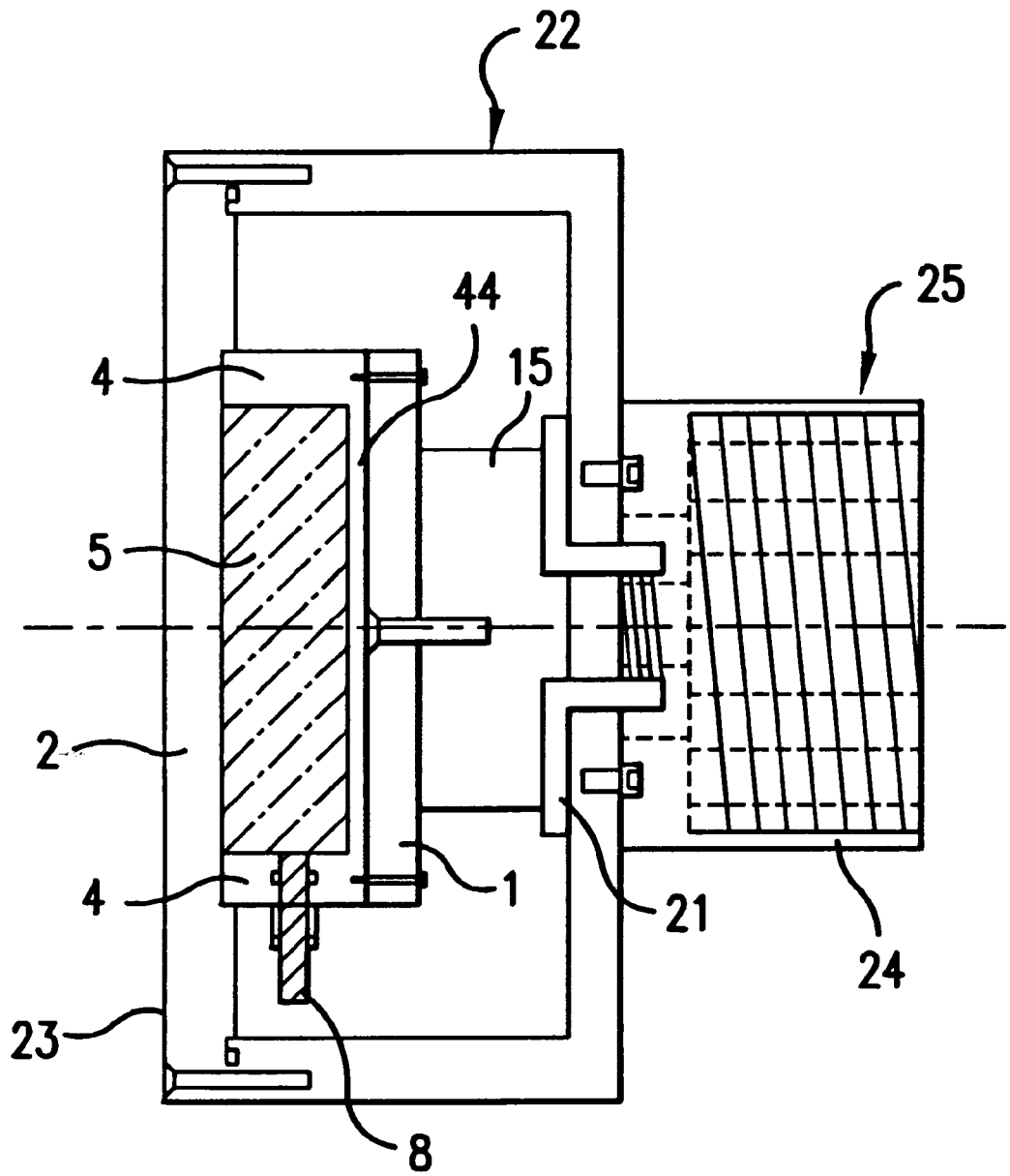
FIG. 1 is a view of a first embodiment of the apparatus according to the invention.

FIG. 1 illustrates a first embodiment of the apparatus according to the invention. It shows a plate capacitor with the two capacitor plates 1, 2. Together with a dielectric wall 4 (here, in the form of a cylinder jacket), they form a cell in which the solution 5 to be heated is situated. The material of the dielectric wall 4 must be thermally insulating. In order to prevent the absorption of microwaves by the dielectric wall 4, the loss factor tan δ should be significantly below 0.01. Suitable materials for this purpose are teflon and PEEK. In the illustrated embodiment, the wall 4 of the cell is simultaneously the wall of a pot with a pot bottom 44 in which the solution 5 to be heated is contained. The pot bottom rests against the capacitor plate 1.

During the process, the occurrence of bubbles and air gaps must be avoided in every case, since they alter the local capacity dramatically, and therefore cause a field distortion. The cell consisting of the capacitor plates 1, 2 and the dielectric wall 4 is therefore arranged, for example, within a cylindrical pressure tank 22 within which a gas pressure exists of approximately 15 bar. Furthermore, the thermal expansion of the solution 5 when heated to 180° C. must be taken into account. This is ensured by a movable dielectric plunger device 8 arranged radially on the dielectric wall 4. Although an arrangement on the capacitor plates 1, 2 is also conceivable, it is less practical because the capacitor plates must be fixedly mounted in order to ensure an optimal electric coupling. As a result of this concept, the differential pressure between the interior of the pressure tank 22 and the solution within the cell is equal to zero at any time.

The walls of the pressure tank 22 are made of metal. According to the invention, one of the two capacitor plates 2 is formed by the central area of the front-side tank wall 23. The other capacitor plate 1 is situated in the interior of the pressure tank 22. The external conductor 24 of the coaxial line 25 is connected with the pressure tank 22. The internal conductor 15 is connected with the capacitor plate 1 in the interior of the pressure tank 22. The pressure tank 22 itself therefore forms a part of the external conductor. The internal feed line 15 is completely shielded by the cylindrical pressure tank 22. Since the whole body is metallically enclosed, it is also ensured that no electromagnetic waves emerge and influence the environment. A teflon insulator 21 insulates the internal coaxial conductor 15 from the external coaxial conductor 22.

Figure 2:
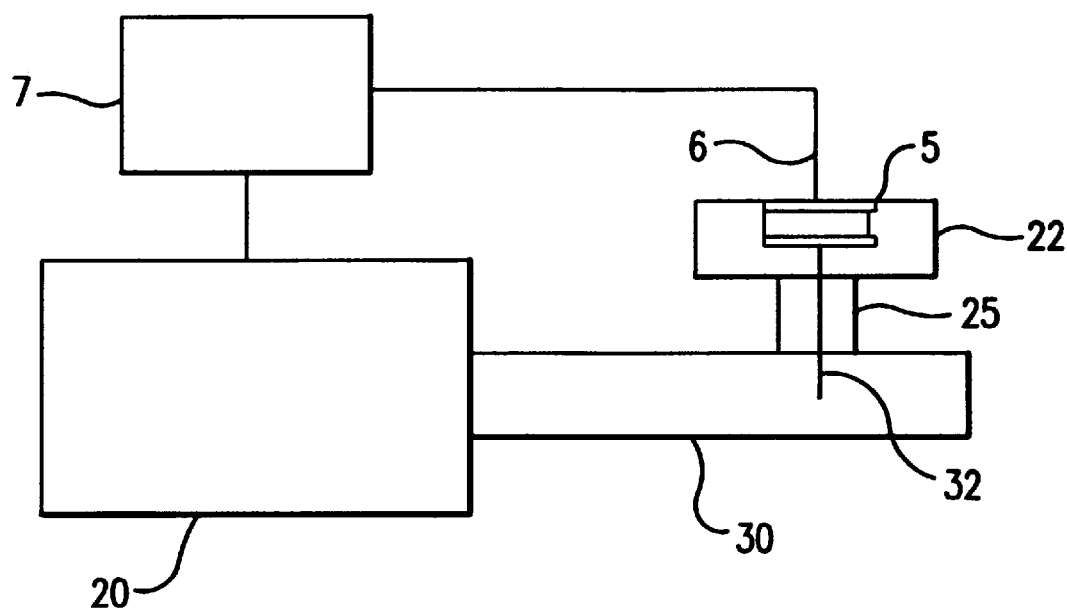
FIG. 2 is a schematic representation of a circuit configuration of the embodiment of FIG. 1.

FIG. 2 illustrates the overall configuration of an apparatus of the invention according to FIG. 1. The power source is a regulatable constant wave magnetron 20 with a short-circuited wave guide output. In this case, the wave guide 30 must be dimensioned such that a stationary or standing wave is formed. At a maximum of the electric field inside the wave guide 30, a conventional coaxial plug is arranged for coupling out the field by way of the antenna 32. The coaxial line 25 guides the microwave frequency to the two capacitor plates inside the pressure tank 22. The construction of the capacitor and the pressure cell corresponds to the construction illustrated in FIG. 1. For measuring the temperature, an encapsulated thermosensor 6 is glued into the cell inside the pressure tank 22. The signal of this sensor represents input signal for the control loop for the temperature control 7.

Figure 3A:
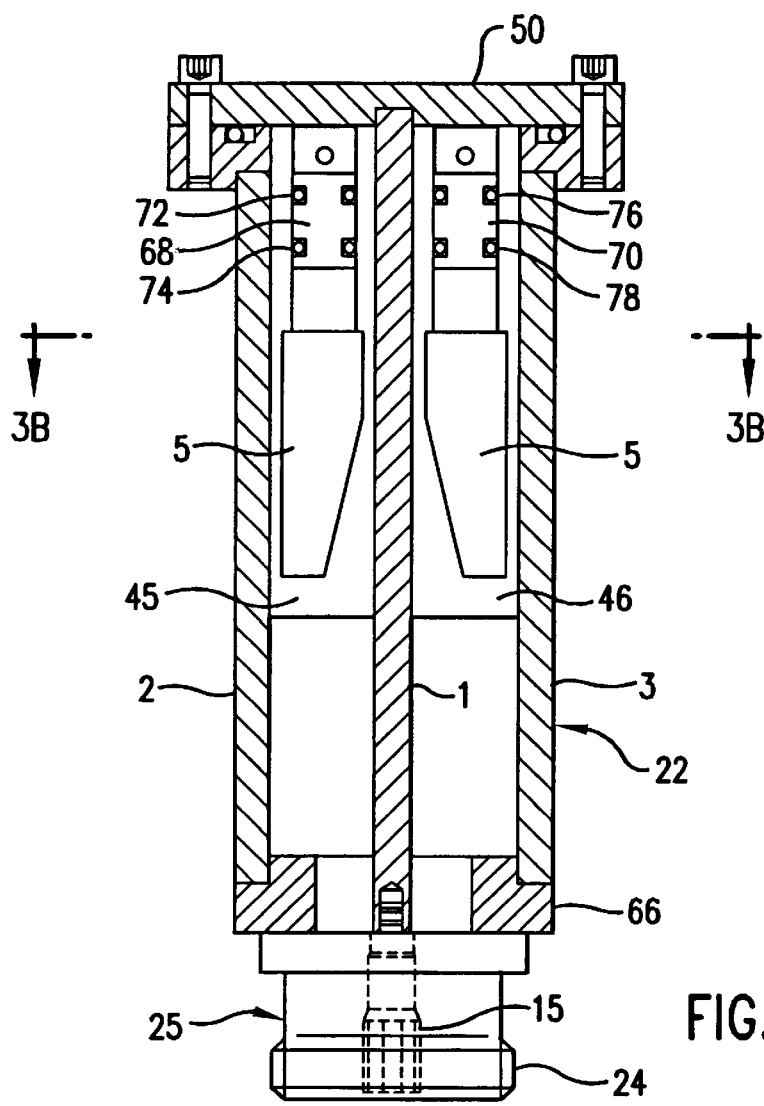
FIGS. 3A and 3B are cross-sectional views of another embodiment of the invention.
Figure 3B:
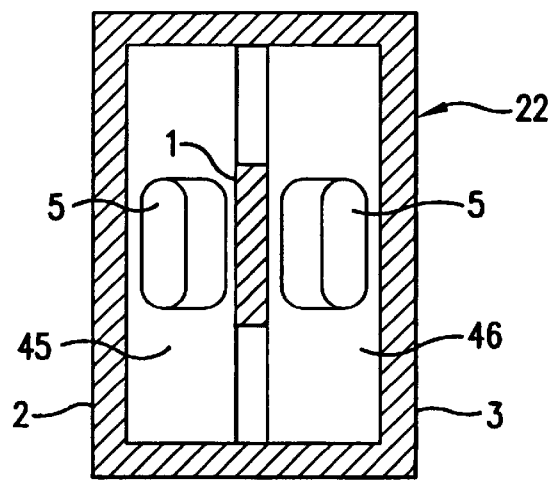

FIG. 3A is a longitudinal sectional (top) view of another embodiment of the apparatus according to the invention, and FIG. 3B is a cross sectional view of the embodiment of FIG. 3A, taken along line IIIB—IIIB. In this case, the metallic pressure tank 22 has a rectangular cross-section. It is connected by way of the flange 66 with the external conductor 24 of the coaxial line 25. In the interior of the pressure tank 22 and parallel to its side walls 2, 3, a capacitor plate 1 is situated which is connected with the internal conductor 15 of the coaxial line 25. In this embodiment, the left wall 2 of the pressure tank 22 and the interior capacitor plate 1 therefore form a first capacitor, and the right wall 3 of the pressure tank 22 and the interior capacitor plate 1 form a second capacitor. As in the embodiment of FIGS. 1 and 2, here also, the pressure tank 22 itself forms a part of the external conductor of the coaxial line 25. Expediently, the external conductor 24 is welded to the flange 66 so that a pressure-tight connection is established. In this embodiment, the coaxial line 25 and the capacitor plates 1, 2, 3 are arranged coaxially.

The aqueous solution 5 to be heated, which is arranged inside the containers 45, 46 made of PTFE, is situated in each case between the capacitor plates 1, 2, 3. For each container, a movable piston 68, 70, which is sealed off by means of O-rings 72, 74, 76, 78, compensates the pressure between the aqueous solution 5 and the interior of the pressure tank 22.

The shape of the containers 45, 46 is such that the portion of the aqueous solution increases in the axial direction with an increasing distance from the coaxial line 25. For this reason, a relatively low portion of the microwave energy is absorbed on the side facing the coaxial line 25 where the electric field is the largest. In contrast, on the side facing the base side 50 of the pressure tank 22, on which the electric field is reduced, a larger portion of the microwave energy is absorbed. By means of this geometry of the liquid containers 45, 46, homogeneous heating along the whole volume of the specimen is achieved.

Advantageous characteristics of this invention are:

an almost homogenous energy input exists in the area of the solution to be heated;

a significantly reduced sensitivity of the input reflection factor exists with respect to changes of the complex dielectric constant of the solution during the processing in comparison to resonator arrangements; the adaptation of the pressure cell is very good for an optimal power charge for the whole heating period;

the coupling to axial lines is simple; and there is a low heat dissipation and therefore a homogeneous heat development in the solution caused by the dielectric walls of the cell made of a material of low thermal conductivity.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. An apparatus for growing zeolite crystals from an aqueous solution, comprising:

a metallic pressure tank for admitting pressure to the aqueous solution; and an arrangement for feeding microwave energy into the aqueous solution, said arrangement comprising a capacitor with capacitor plates between which the aqueous solution is situated; wherein one of the capacitor plates is formed by a wall of the metallic pressure tank; and the other capacitor plate is arranged in an interior of the metallic pressure tank.

2. An apparatus according to claim 1, wherein the arrangement for feeding microwave energy further comprises a coaxial line connected with the capacitor.

3. An apparatus according to claim 2, wherein an external conductor of the coaxial line is connected with the pressure tank.

4. An apparatus according to claim 3, wherein an internal conductor of the coaxial line is connected with the capacitor plate arranged in the interior of the pressure tank.

5. An apparatus according to claim 2, wherein an internal conductor of the coaxial line is connected with the capacitor plate arranged in the interior of the pressure tank.

6. An apparatus according to claim 2, wherein the coaxial line and the capacitor plates are arranged coaxially with respect to one another.

7. An apparatus according to claim 2, wherein the coaxial line and the capacitor plates are arranged perpendicularly to one another.

8. An apparatus according to claim 1, wherein the aqueous solution is situated inside a dielectric container.

9. An apparatus according to claim 8, wherein the dielectric container is made of a material selected from the group consisting of teflon and PEEK.

10. An apparatus according to claim 1, further comprising apparatus for the pressure compensation between the pressure tank and the solution to be heated.

11. An apparatus according to claim 10, wherein the apparatus for pressure compensation comprises a movable piston.

12. An apparatus according to claim 1, wherein the capacitor plate arranged in the interior of the pressure tank, together with another wall of the pressure tank, forms another capacitor between whose plates the aqueous solution is situated.

* * * * *